(12) United States Patent
Yang et al.

(10) Patent No.: US 11,774,468 B2
(45) Date of Patent: Oct. 3, 2023

(54) VERTICAL PROBE HEAD

(71) Applicant: MPI CORPORATION, Chu-Pei (TW)

(72) Inventors: Chin-Tien Yang, Chu-Pei (TW);
Yang-Hung Cheng, Chu-Pei (TW);
Yu-Hao Chen, Chu-Pei (TW); Chin-Yi Tsai, Chu-Pei (TW); Hui-Pin Yang, Chu-Pei (TW); Horng-Chuan Sun, Chu-Pei (TW)

(73) Assignee: MPI CORPORATION, Chu-Pei (TW)

( * ) Notice: Subject to any disclaimer, the term of this patent is extended or adjusted under 35 U.S.C. 154(b) by 0 days.

(21) Appl. No.: 17/858,424

(22) Filed: Jul. 6, 2022

(65) Prior Publication Data
US 2023/0007997 A1    Jan. 12, 2023

Related U.S. Application Data

(60) Provisional application No. 63/218,937, filed on Jul. 7, 2021.

(51) Int. Cl.
*G01R 1/073*    (2006.01)

(52) U.S. Cl.
CPC ..... *G01R 1/07314* (2013.01); *G01R 1/07357* (2013.01)

(58) Field of Classification Search
CPC .......... G01R 1/07314; G01R 1/07357
See application file for complete search history.

(56) References Cited

U.S. PATENT DOCUMENTS

| | | | | |
|---|---|---|---|---|
| 2009/0002009 A1* | 1/2009 | Brandorff | .......... | G01R 1/07357 324/750.16 |
| 2013/0249584 A1* | 9/2013 | Lou | .......... | G01R 1/07342 324/755.07 |
| 2017/0082656 A1* | 3/2017 | Chen | .......... | H01R 13/4364 |
| 2018/0011126 A1* | 1/2018 | Acconcia | .......... | G01R 1/06733 |
| 2021/0003609 A1* | 1/2021 | Huang | .......... | G01R 1/0675 |
| 2022/0011346 A1* | 1/2022 | Lee | .......... | G01R 1/07314 |
| 2022/0163565 A1* | 5/2022 | Hsieh | .......... | G01R 1/06716 |

FOREIGN PATENT DOCUMENTS

WO    WO-2012070188 A1 *    5/2012    ......... G01R 1/06738

OTHER PUBLICATIONS

Translation of TWI798127B (Year: 2023).*
Translation of JP2012242178A (Year: 2012).*

* cited by examiner

*Primary Examiner* — Paresh Patel
(74) *Attorney, Agent, or Firm* — Birch, Stewart, Kolasch & Birch, LLP

(57) ABSTRACT

A vertical probe head includes upper and lower die units having upper and lower through holes, and probes each including a body portion between the die units, tail and head portion installation parts in the upper and lower through holes respectively, and a head portion contact part for electrically contacting a device under test. The probes include a pair of signal probes including at least one distinctive probe, for which, the body portion is smaller in width than the head portion installation part, and a body portion center line is deviated from a head portion installation part center line toward the probe paired thereto. For the paired probes, a head portion contact part pitch is larger than a body portion pitch for matching a large-pitch high-speed differential pair of the device under test, great impedance matching effect, and consistent contact force and stable elasticity of the probes in operation.

21 Claims, 11 Drawing Sheets

VERTICAL PROBE HEAD

BACKGROUND OF THE INVENTION

1. Field of the Invention

The present invention relates to probe heads of probe cards and more particularly, to a vertical probe head.

2. Description of the Related Art

Referring to FIG. 1, a conventional vertical probe head 10 includes an upper die unit 11 (including at least one upper die), a lower die unit 12 (including at least one lower die) disposed below the upper die unit 11, and a plurality of probes 13 inserted through the upper and lower die units 11 and 12. Each probe 13 is defined with a tail portion 132 partially located in the upper die unit 11 and partially protruding out upwardly from the top surface of the upper die unit 11, a head portion 134 partially located in the lower die unit 12 and partially protruding out downwardly from the bottom surface of the lower die unit 12, and a body portion 136 located between the upper and lower die units 11 and 12. After the probes 13 are inserted through the upper and lower die units 11 and 12, the upper and lower die units 11 and 12 will be moved relative to each other along X-axis (horizontally), thereby offset from each other (FIG. 1 shows the status of being not offset yet), such that the tail portion 132 and head portion 134 of each probe 13 are not located on a same vertical axial line parallel to Y-axis and the body portion 136 of each probe 13 is buckling-shaped. That means the body portions 136 of the probes 13 are identically pre-bended toward a predetermined direction, such that when the test is performed and the body portions 136 of the probes 13 are deformed elastically, the contact force of each probe 13 is controllable, and the body portions 136 of the probes 13 are ensured with gaps to avoid short circuit caused by contact. The top end of the tail portion 132 of each probe 13 is adapted to receive signal provided by a tester (not shown) (generally speaking, the probe 13 is electrically connected with the tester through a circuit board of a probe card). The bottom end of the head portion 134 of each probe 13 is adapted to probe an electrically conductive contact of a device under test (not shown), thereby transmitting the signal provided by the tester to the device under test or transmitting the signal generated by the device under test to the tester.

In the condition that the electrically conductive contacts of the device under test include a high-speed differential pair, the high-speed differential pair usually has a relatively larger center-to-center distance (pitch). For example, the pitch between general electrically conductive contacts is 80 μm, and the pitch of the high-speed differential pair is 120-160 μm. In such condition, the probes 13 of the vertical probe head 10 for probing the high-speed differential pair of the device under test should correspondingly have a relatively larger pitch. The condition can be imagined that the probes corresponding to the high-speed differential pair and the probes corresponding to the non-high-speed differential pair all use probes of standard probe type. For example, the probes 13 shown in FIG. 1 correspond to the non-high-speed differential pair, and the probes 13 shown in FIG. 2 correspond to the high-speed differential pair. The probes 13 shown in FIG. 1 and FIG. 2 are the same in shape, but the pitch P between the probes 13 shown in FIG. 1 is smaller than the pitch P between the probes 13 shown in FIG. 2. In this way, the probes 13 corresponding to the high-speed differential pair as shown in FIG. 2 have a relatively larger gap G therebetween, thereby causing them bad impedance matching effect.

For matching the high-speed differential pair of the device under test with the relatively larger pitch and meanwhile solving the problem of bad impedance matching effect resulted from the too large gap between the probes, the conventional technique is changing the probes corresponding to the high-speed differential pair into probes wider than the standard probe type (as shown in FIG. 1), such as probes 13' as shown in FIG. 3 having the width W larger than the width W of the probes 13 as shown in FIG. 1 and FIG. 2. As the probes 13 shown in FIG. 2, the probes 13' shown in FIG. 3 also have a relatively larger pitch P, adapted for probing the high-speed differential pair of the device under test with the relatively larger pitch. Besides, the width W of the probes 13' shown in FIG. 3 is larger, so the gap G between the probes 13' is smaller than the gap G shown in FIG. 2, which can solve the problem of bad impedance matching effect.

However, in the condition that the probes have the increased width W, for preventing them from applying too large contact force to the device under test or applying contact force inconsistent to that of other probes, the body portion 136 of the probe with the increased width should correspondingly have a decreased thickness (defined along Z-axis) to a very thin extent. Because of having uneven geometric shape (wide flat shape), such body portion 136, when operating, is liable to distort toward a non-predetermined direction, thereby having the problem of instable elasticity.

SUMMARY OF THE INVENTION

In view of the above-noted defects, it is a primary objective of the present invention to provide a vertical probe head, which has probes capable of corresponding to a high-speed differential pair of a device under test with a relatively larger pitch and having great impedance matching effect, and the probes can be maintained with consistent contact force and prevented from the problem of instable elasticity when operating.

To attain the above objective, the present invention provides a vertical probe head which includes a probe seat and a plurality of probes. The probe seat includes an upper die unit and a lower die unit. The upper die unit includes at least one upper die, and a plurality of upper through holes penetrating through the at least one upper die. The lower die unit includes at least one lower die, and a plurality of lower through holes penetrating through the at least one lower die. The upper die unit and lower die unit each have an upper surface and a lower surface. The lower surface of the upper die unit faces toward the upper surface of the lower die unit. Each probe is inserted through an upper through hole and a lower through hole. Each probe includes a tail portion, a head portion, and a body portion located between the tail portion and the head portion. The tail portion includes a tail portion contact part for electrically contacting a circuit board (main circuit board or space transformer) of a probe card, and a tail portion installation part located between the tail portion contact part and the body portion and at least partially accommodated in the upper through hole. The head portion includes a head portion installation part at least partially accommodated in the lower through hole, and a head portion contact part located below the lower surface of the lower die unit for electrically contacting a device under test. The body portion is located between the lower surface of the upper die unit and the upper surface of the lower die unit. The body portion is defined with a body portion center line. The head portion contact part is defined with a head portion contact part center line. The head portion installation part is defined with a head portion installation part center line. The plurality of probes include at least one pair of signal probes. The at least one pair of signal probes include a first signal probe and a second signal probe located adjacent to each other. At least one of the first signal probe and second signal probe is a distinctive probe. The width of the body portion of the distinctive probe is smaller than the width of the head portion installation part of the distinctive probe, and the body portion center line of the distinctive probe is deviated from the head portion installation part center line of the distinctive probe itself toward the probe paired with the distinctive probe. The shortest distance between the head portion contact part center line of the first signal probe and the head portion contact part center line of the second signal probe (also called head portion contact part pitch hereinafter) is larger than the shortest distance between the body portion center line of the first signal probe and the body portion center line of the second signal probe (also called body portion pitch hereinafter).

As a result, the first and second signal probes of the vertical probe head of the present invention may be a standard probe paired with a distinctive probe, or a distinctive probe paired with another distinctive probe. For the distinctive probe, the width of the body portion is smaller than the width of the head portion installation part, and the body portion center line is deviated from the head portion installation part center line and the deviated direction thereof is the direction toward the other probe of the same pair, so that the body portions of the first and second signal probes can be located close to each other, thereby ensuring an appropriate distance therebetween to achieve the required impedance matching effect. Meanwhile, the body portion of the distinctive probe can be prevented from too large width, so the body portion of the distinctive probe doesn't need a decreased thickness to a very thin extent but can still have as small area moment of inertia as the standard probe, so that they can apply appropriate and consistent contact force to the device under test and can avoid the problem of instable elasticity when operating. Besides, for the distinctive probe, the width of the head portion installation part is larger than the width of the body portion, enabling the head portion contact part to be configured in a way that the head portion contact part center line thereof is deviated from the body portion center line, so that the center-to-center distance of the head portion contact parts of the first and second signal probes is larger than the center-to-center distance of the body portions. In other words, the first and second signal probes have a larger center-to-center distance at the head portion contact parts, and a smaller center-to-center distance at the body portions. As a result, the center-to-center distance of the head portion contact parts of the first and second signal probes can be arranged correspondingly to the pitch of the electrically conductive contacts of the device under test, not restricted by the requirement of relatively smaller center-to-center distance of the body portions for generating great impedance matching effect. Therefore, the head portion contact parts of the first and second signal probes can probe the high-speed differential pair of the device under test with the relatively larger pitch. Meanwhile, the body portion usually takes up a relatively larger proportion of the length of the probe, so using the relatively smaller center-to-center distance of the body portions to increase coupling capacitance can achieve great impedance matching effect.

Preferably, the width of the head portion contact part of the distinctive probe may be larger than the width of the body portion of the distinctive probe for achieving the structural feature of the first and second signal probes that the head portion contact part pitch is larger than the body portion pitch. Alternatively, the head portion contact part center line of the distinctive probe may be deviated from the head portion installation part center line corresponding thereto for achieving the structural feature of the first and second signal probes that the head portion contact part pitch is larger than the body portion pitch, which can also make the shortest distance between the head portion contact parts of the first and second signal probes larger than the shortest distance between the body portions of the first and second signal probes. Such probes can meet the requirement of providing higher accuracy in probing the electrically conductive contacts of the device under test for the high-speed differential pair of electrically conductive contacts with the relatively larger pitch, and meanwhile can also maintain the relatively smaller center-to-center distance of the body portions to increase coupling capacitance for achieving great impedance matching effect.

Preferably, the tail portion contact part of each probe is defined with a tail portion contact part center line, and the width of the tail portion contact part of the distinctive probe may be larger than the width of the body portion of the distinctive probe for achieving the structural feature of the first and second signal probes that the shortest distance between the tail portion contact part center lines (also called tail portion contact part pitch hereinafter) is larger than the body portion pitch. Alternatively, the tail portion contact part center line of the distinctive probe may be deviated from the tail portion installation part center line corresponding thereto for achieving the structural feature of the first and second signal probes that the tail portion contact part pitch is larger than the body portion pitch, which can also make the shortest distance between the tail portion contact parts of the first and second signal probes larger than the shortest distance between the body portions of the first and second signal probes. Such probes can maintain the relatively smaller center-to-center distance of the body portions to increase coupling capacitance for achieving great impedance matching effect, and in such precondition, can be abutted against the electrically conductive contacts of the circuit board of the probe card more accurately.

Preferably, the tail portion contact part of each probe is defined with a tail portion contact part center line, and the tail portion installation part of each probe is defined with a tail portion installation part center line. The upper and lower die units are adapted to be offset from each other along a horizontal axis to make each probe transform from a straight status into a buckled status. When the first and second signal probes are in the straight status, the body portion center line, head portion contact part center line and tail portion contact part center line of the first signal probe are superimposed on each other, and the body portion center line of the second signal probe is deviated from the head portion installation part center line and tail portion installation part center line of the second signal probe. That means among the paired first and second signal probes, only the second signal probe is the distinctive probe, but the first signal probe is the standard probe. In this way, it can also achieve the structural features of the first and second signal probes that the head portion contact part pitch is larger than the body portion pitch, and the tail portion contact part pitch is larger than the body portion pitch. Such probes can meet the requirement of providing higher accuracy in probing the electrically conductive contacts of the device under test for the high-speed differential pair of electrically conductive contacts with the relatively larger pitch, and meanwhile can also maintain the relatively smaller center-to-center distance of the body portions to increase coupling capacitance for achieving great impedance matching effect.

Preferably, the vertical probe head is defined with a first horizontal axis and a second horizontal axis perpendicular to each other. The upper and lower die units are adapted to be offset from each other along the first horizontal axis to make each probe transform from a straight status into a buckled status. The first and second signal probes are both the distinctive probes and disposed symmetrically with respect to an imaginary reference surface (may be perpendicular to the first horizontal axis, perpendicular to the second horizontal axis, or inclined relative to the first and second horizontal axes) when in the straight status. As a result, in the precondition of achieving the required body portion pitch for obtaining the required impedance matching effect, it has no need to deviate the head portion contact part center line and body portion center line of the distinctive probe from each other to a very large extent, and the required head portion contact part pitch can be still achieved.

The detailed structure, features, assembly or usage of the vertical probe head provided by the present invention will be described in the following detailed description of embodiments. However, those skilled in the field of the present invention should understand that the detailed descriptions and specific embodiments instanced for implementing the present invention are given by way of illustration only, not intended to limit the scope of the claims of the present invention.

DETAILED DESCRIPTION OF THE INVENTION

Figure 1:
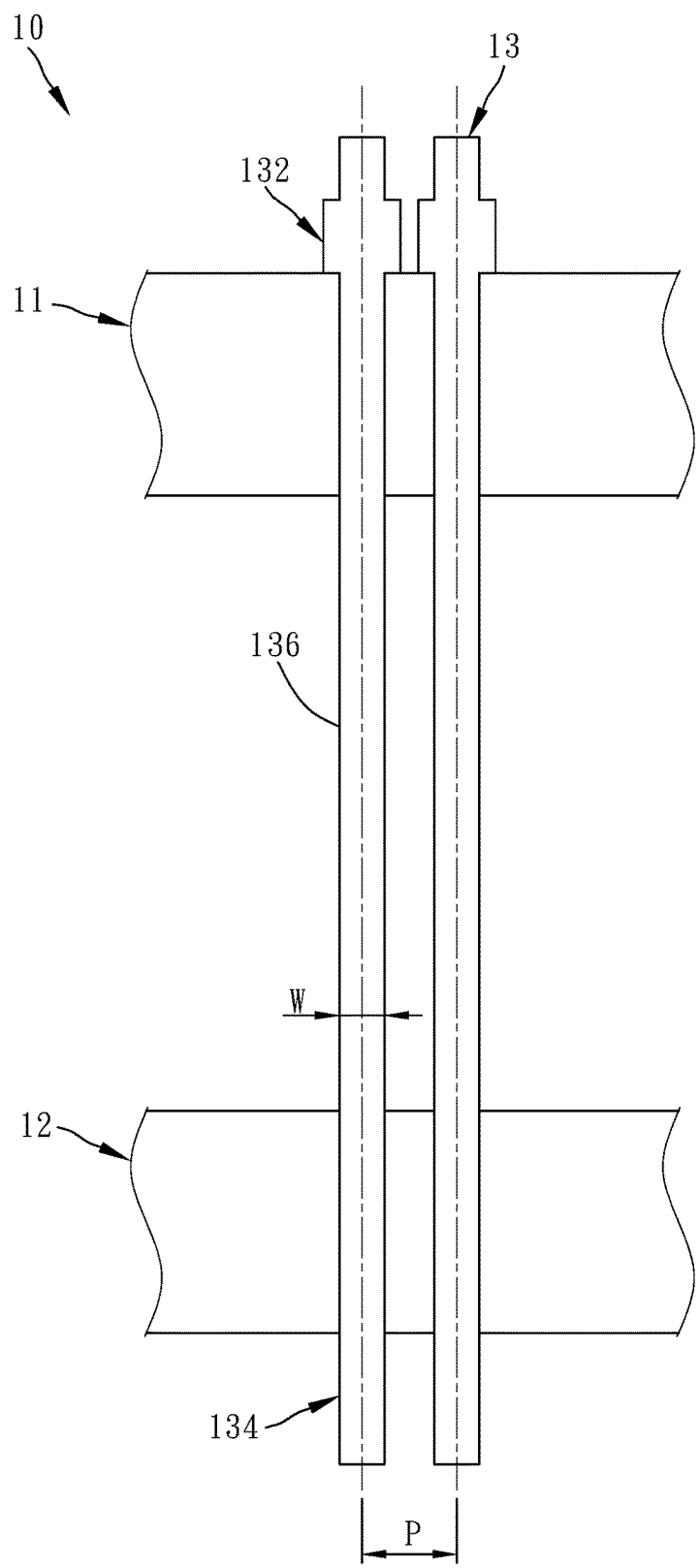
FIG. 1 to FIG. 3 are partial schematic sectional views of a conventional vertical probe head.
Figure 1:
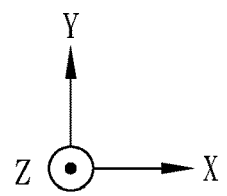
Figure 2:
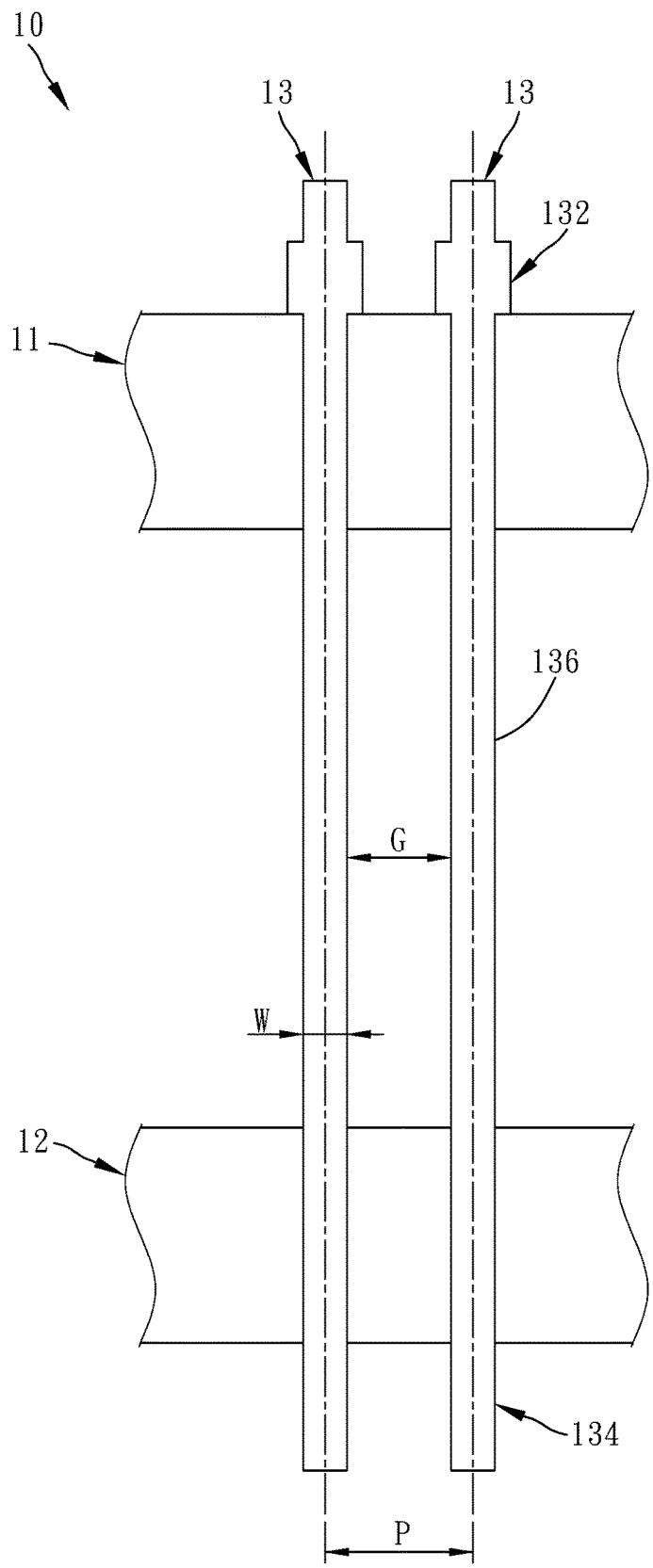
Figure 3:
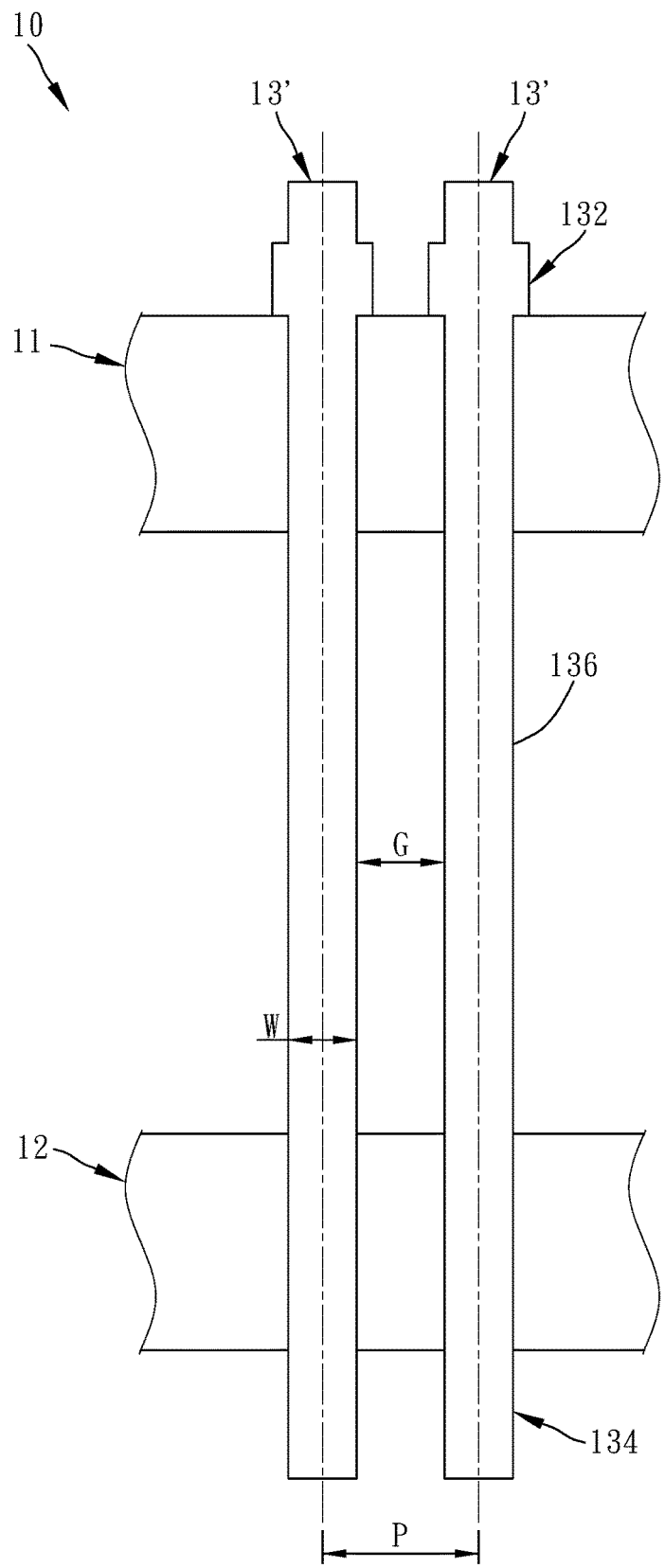

First of all, it is to be mentioned that same or similar reference numerals used in the following embodiments and the appendix drawings designate same or similar elements or the structural features thereof. It should be noticed that for the convenience of illustration, the components and the structure shown in the figures are not drawn according to the real scale and amount, and the features mentioned in each embodiment can be applied in the other embodiments if the application is possible in practice. Besides, when it is mentioned that an element is disposed on another element, it means that the former element is directly disposed on the latter element, or the former element is indirectly disposed on the latter element through one or more other elements between aforesaid former and latter elements. When it is mentioned that an element is 'directly' disposed on another element, it means that no other element is disposed between aforesaid former and latter elements.

Figure 4:
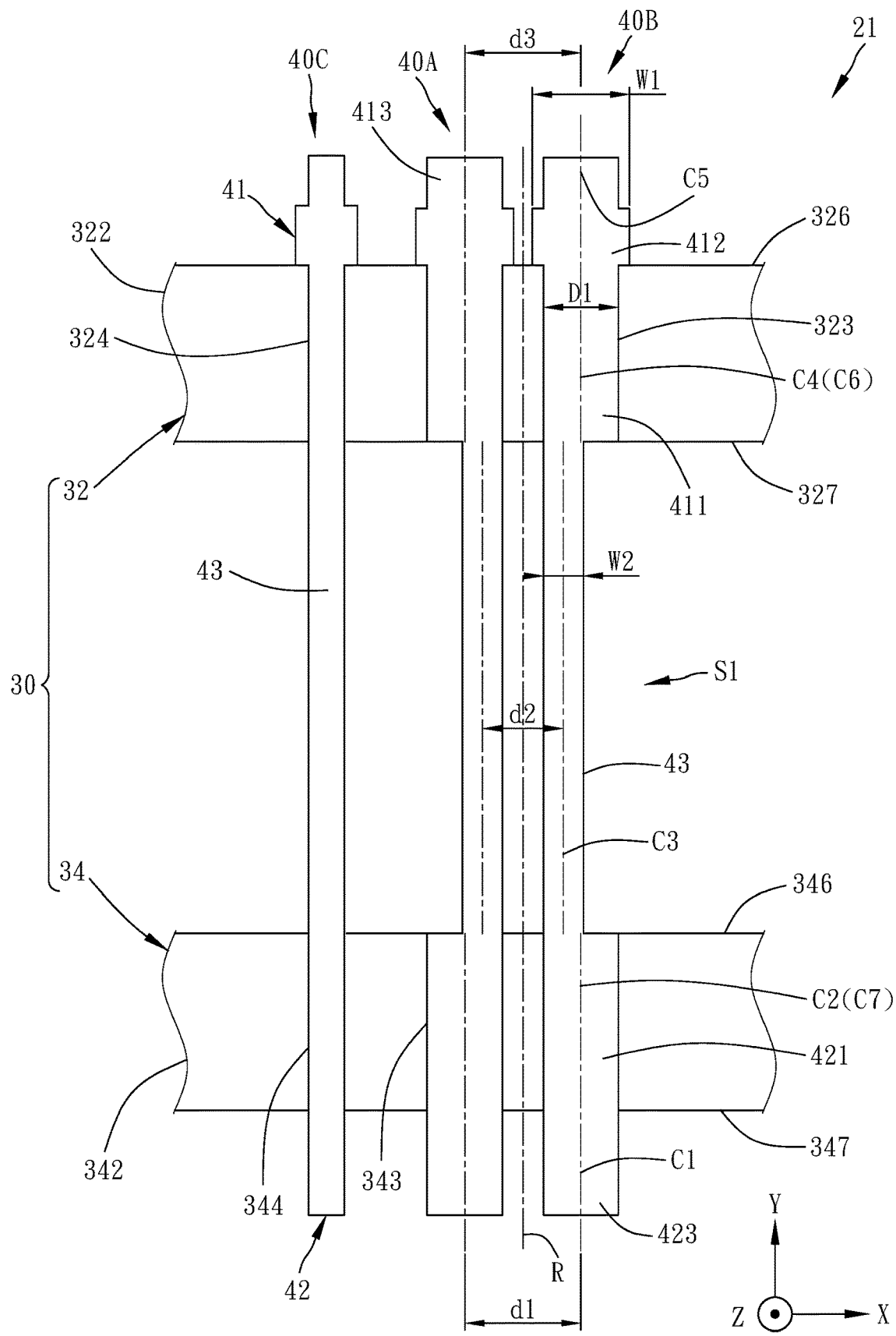
FIG. 4 is a partial schematic sectional view of a vertical probe head according to a first preferred embodiment of the present invention.

Referring to FIG. 4, a vertical probe head 21 according to a first preferred embodiment of the present invention includes a probe seat 30, and a plurality of probes. The vertical probe head usually includes thousands to tens thousands of probes in practice. For the simplification of the figures and the convenience of illustration, only three of the probes 40A-C are shown in each figure of the present invention, which are also called first signal probe 40A, second signal probe 40B and third signal probe 40C in the present invention. The first and second signal probes 40A, 40B are paired signal probes located adjacent to each other and may, but not limited to, be the probes for probing a high-speed differential pair of a device under test (not shown). The third signal probe 40C is provided as a representative of other standard probes of the vertical probe head for probing general electrically conductive contacts of the device under test, such as grounding probe.

The probe seat 30 includes an upper die unit 32 and a lower die unit 34. The upper die unit 32 includes at least one upper die 322, and a plurality of upper through holes 323, 324 (specified in the following) penetrating through the at least one upper die 322. The lower die unit 34 includes at least one lower die 342, and a plurality of lower through holes 343, 344 (specified in the following) penetrating through the at least one lower die 342. The amount of the upper through holes 323, 324 and the amount of the lower through holes 343, 344 both correspond to the amount of the probes. In each figure of the present invention, only three upper through holes 323, 324 and three lower through holes 343, 344 corresponding to the probes 40A-C are shown. The upper and lower die units 32, 34 in this embodiment only include an upper die 322 and a lower die 342, respectively. However, in the condition that the upper die unit 32 needs a relatively larger thickness, for avoiding a problem that the upper through holes 323, 324 should penetrate through a single thick die, which may make the drilling process uneasy to be performed, the upper die unit 32 may be composed of a plurality of upper dies 322 piled on one another so that a same upper through hole 323, 324 is provided in the plurality of upper dies 322 in a segmented drilling manner. Likewise, the lower die unit 34 may be composed of a plurality of lower dies 342 piled on one another to avoid that the drilling process for the lower through holes 343, 344 is uneasy to be performed. The upper die unit 32 has an upper surface 326 and a lower surface 327. The lower die unit 34 has an upper surface 346 and a lower surface 347. The lower surface 327 of the upper die unit 32 faces toward the upper surface 346 of the lower die unit 34. In other words, the upper die unit 32 is disposed above the lower die unit 34 approximately parallel to the lower die unit 34. The outer peripheries (not shown) of the upper and lower die units 32, 34 may be provided with portions protruding toward each other and thereby fastened to each other directly. Alternatively, the outer peripheries of the upper and lower die units 32, 34 may be fastened to each other indirectly through a hollow middle die (not shown) disposed therebetween. This part is less related to the technical features of the present invention, thereby not shown in the figures.

The probes 40A-C are initially disposed in a straight status S1 as shown in FIG. 4, and each inserted through an upper through hole 323 or 324 and a lower through hole 343 or 344 in this status. Meanwhile, the probes 40A-C are each defined with a tail portion 41, a head portion 42, and a body portion 43 located between the tail portion 41 and the head portion 42. The body portion 43 is located between the lower surface 327 of the upper die unit 32 and the upper surface 346 of the lower die unit 34. The tail portion 41 includes a tail portion installation part 411 connected with the body portion 43 and accommodated in the upper through hole 323 or 324, an upper stopping part 412 connected with the tail portion installation part 411 and located above the upper through hole 323 or 324, and a tail portion contact part 413 connected with the upper stopping part 412 and located at the top of the probe. The head portion 42 includes a head portion installation part 421 connected with the body portion 43 and accommodated in the lower through hole 343 or 344, and a head portion contact part 423 located below the lower surface 347 of the lower die unit 34. The tail portion contact part 413 protrudes out of the upper surface 326 of the upper die unit 32. The head portion contact part 423 protrudes out of the lower surface 347 of the lower die unit 34. The width of the upper stopping part 412 of each of the probes 40A-C is larger than the width of the upper through hole 323 or 324 corresponding thereto. For example, the width W1 of the upper stopping part 412 of the probe 40B shown in FIG. 4 is larger than the width D1 of the upper through hole 323 corresponding thereto. Therefore, the upper stopping parts 412 of the probes 40A-C can be abutted on the upper surface 326 of the upper die unit 32, so that the probes 40A-C are positioned in the probe seat 30 and prevented from falling down. This embodiment is described in a way that the cross sections of the upper through hole 323 or 324 and lower through hole 343 or 344 are square or rectangular in shape. However, the upper through hole 323 or 324 and lower through hole 343 or 344 may be circular in shape. In the circular shape condition, the widths of the upper through hole 323 or 324 and lower through hole 343 or 344 both equal to the diameters of the through holes.

Figure 5:
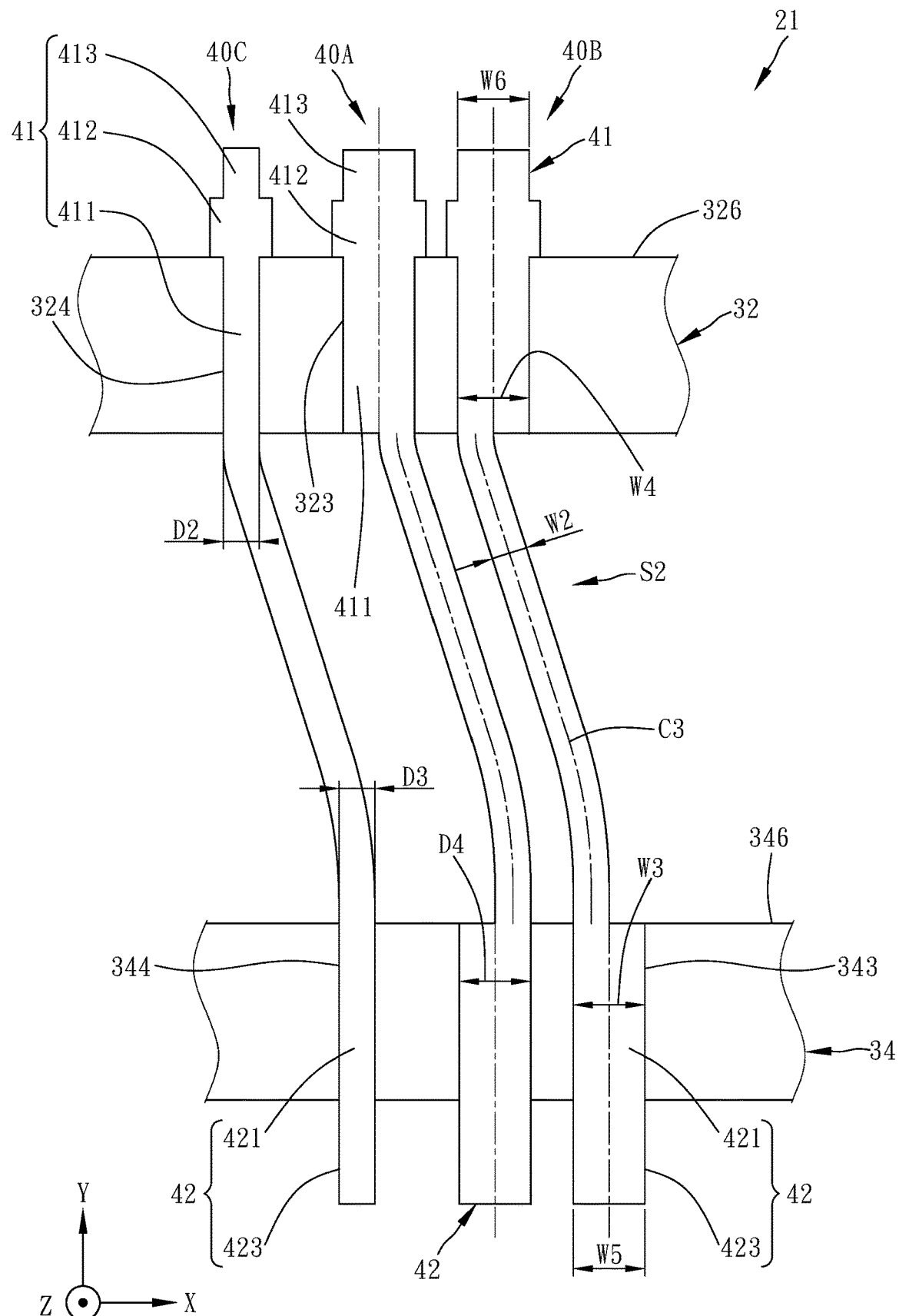
FIG. 5 is similar to FIG. 4, but showing probes of the vertical probe head are in a buckled status.

After the probes are all inserted through the probe seat 30, the upper and lower die units 32, 34 are offset from each other along a first horizontal axis (X-axis) to cause the probes 40A-C to transform from the straight status S1 into a buckled status S2 (as shown in FIG. 5), and then the upper and lower die units 32, 34 are fastened to each other in this status directly or indirectly in the above-described manner, such that the assembly of the vertical probe head 21 is accomplished. The head portion contact parts 423 of the probes 40A-C are adapted for electrically contacting the electrically conductive contacts of the device under test. The tail portion contact parts 413 of the probes 40A-C are adapted for electrically contacting a circuit board (not shown) of a probe card. The circuit board may be a main circuit board of the probe card, such that the vertical probe head 21 and the main circuit board compose the probe card. Alternatively, the circuit board may be a space transformer of the probe card, which is disposed between the main circuit board and the vertical probe head 21, such that the vertical probe head 21, the space transformer and the main circuit board compose the probe card. When the vertical probe head 21 is completely assembled and in contact with the circuit board as described above, the probes 40A-C are applied with a slight force, and the upper stopping parts 412 thereof may be still abutted on the upper surface 326 of the upper die unit 32 as shown in FIG. 5, or may be a little moved upwardly from the upper surface 326 of the upper die unit 32. Therefore, the tail portion installation parts 411 and head portion installation parts 421 may a little protrude out of the upper surfaces 326, 346 of the upper and lower die units 32, 34 respectively, thereby partially located out of the upper and lower through holes 323, 324, 343, 344.

The detailed structural features of the vertical probe head of the present invention will be specified in the following. It should be firstly mentioned here that the probes in all embodiments of the present invention (especially the following mentioned distinctive probe) primarily refer to probes made of plates by laser cutting, etching or other processing manners, or probes formed by microelectromechanical system (MEMS) manufacturing process, the cross sections of which are mostly rectangular in shape. Therefore, the probes can be defined with widths and thicknesses according to the orientation thereof when in manufacture. In each figure of the present invention, each part of the probe has a width on X-axis (first horizontal axis) and a thickness on Z-axis (second horizontal axis). Besides, in each figure of the present invention, X-axis is also an offset axis, along which the upper and lower die units 32, 34 are offset from each other to cause the probes to transform from the straight status S1 into the buckled status S2. However, for each part of the probe in the present invention, the width is primarily defined on the aligning direction of the paired first and second signal probes 40A, 40B, and the thickness is defined on the direction perpendicular to the aligning direction. In other words, lateral surfaces of the first and second signal probes 40A, 40B, on which the thicknesses thereof are defined, face toward each other. In each figure of the present invention, the aligning direction of the first and second signal probes 40A, 40B is on X-axis, i.e. the aforementioned offset axis. However, the aligning direction of the first and second signal probes 40A, 40B may be on Z-axis, or inclined relatively to X-axis and Z-axis. Besides, the probes of the present invention are not limited to be rectangular in cross-sectional shape, but may be circular or polygonal in cross-sectional shape. In particular, the standard probe may be the above-described probe made of plate by processing or formed by MEMS manufacturing process, or may be the probe made of a cylinder wire by direct cutting or by pressing. In the condition that the probe is circular in cross-sectional shape, the width and thickness of the probe both equal to the diameter of the probe. In the condition that the probes are polygonal (e.g. trapezoidal) in cross-sectional shape, the comparison between the widths of the probes is to compare the widths of the probes on a same vertical section.

As shown in FIG. 4, the head portion contact part 423, head portion installation part 421, body portion 43, tail portion installation part 411 and tail portion contact part 413 of each of the probes 40A-C are defined with a head portion contact part center line C1, a head portion installation part center line C2, a body portion center line C3, a tail portion installation part center line C4 and a tail portion contact part center line C5, respectively. Each of the upper through holes 323, 324 is defined with an upper through hole center line C6 (in this embodiment C4, C5 and C6 are superimposed on each other, i.e. colinear). Each of the lower through holes 343, 344 is defined with a lower through hole center line C7 (in this embodiment C1, C2, C7 are colinear). As shown in FIG. 5, when the probes 40A-C are in the buckled status S2, the body portion center lines C3 thereof are curves, so it can be seen that the center line of each part mentioned in the present invention is not limited to a straight line.

In this embodiment, the third signal probe 40C is a standard probe. The first and second signal probes 40A, 40B are symmetric in shape to each other, and each a distinctive probe. The standard probe 40C is almost entirely uniform in width, but only the upper stopping part 412 is relatively larger in width. The width of the body portions 43 of the distinctive probes 40A, 40B is approximately equal to the width of the body portion 43 of the standard probe 40C, and the rest parts are all wider than the standard probe 40C. Therefore, for the distinctive probes 40A, 40B in this embodiment, the width W2 of the body portion 43 is smaller than the width W3 of the head portion installation part 421, the width W4 of the tail portion installation part 411, the width W5 of the head portion contact part 423 and/or the width W6 of the tail portion contact part 413, the body portion center line C3 is deviated from the head portion installation part center line C2, and the body portion center line C3 is deviated from the tail portion installation part center line C4. Specifically speaking of the aforementioned 'deviated', as shown in FIG. 4, when the first and second signal probes 40A, 40B are in the straight status S1, the body portion center line C3 is offset from the head portion installation part center line C2 and/or tail portion installation part center line C4 on X-axis (first horizontal axis). More specifically speaking, the body portion center line C3 is offset from the head portion installation part center line C2 and/or tail portion installation part center line C4 on X-axis (first horizontal axis) at the juncture of the body portion 43 and the head portion 42 and/or tail portion 41. The body portion center line C3 is not connected with the head portion installation part center line C2 and/or tail portion installation part center line C4. More specifically speaking, the body portion center line C3 is not connected with the head portion installation part center line C2 and/or tail portion installation part center line C4 at the juncture of the body portion 43 and the head portion 42 and/or tail portion 41. The extending line of the body portion center line C3 is not superimposed on the head portion installation part center line C2 and/or tail portion installation part center line C4. In addition, as shown in FIG. 5, when the first and second signal probes 40A, 40B are in the buckled status S2, the body portion center line C3 is offset from the head portion installation part center line C2 and/or tail portion installation part center line C4 on X-axis (first horizontal axis). More specifically speaking, the body portion center line C3 is offset from the head portion installation part center line C2 and/or tail portion installation part center line C4 on X-axis (first horizontal axis) at the juncture of the body portion 43 and the head portion 42 and/or tail portion 41. The body portion center line C3 is not connected with the head portion installation part center line C2 and/or tail portion installation part center line C4. More specifically speaking, the body portion center line C3 is not connected with the head portion installation part center line C2 and/or tail portion installation part center line C4 at the juncture of the body portion 43 and the head portion 42 and/or tail portion 41. Besides, the first and second signal probes 40A, 40B in this embodiment, when in the straight status S1, are disposed symmetrically with respect to an imaginary reference surface R perpendicular to X-axis, the body portion center line C3 of the first signal probe 40A is deviated from the head portion installation part center line C2 and/or tail portion installation part center line C4 of the first signal probe 40A itself toward the second signal probe 40B (i.e. toward the positive direction of X-axis), and the body portion center line C3 of the second signal probe 40B is deviated from the head portion installation part center line C2 and tail portion installation part center line C4 of the second signal probe 40B itself toward the first signal probe 40A (i.e. toward the negative direction of X-axis). Furthermore, for the same probe, C1 and C2 are colinear and C4 and C5 are colinear. Therefore, the shortest distance between the head portion contact part center line C1 of the first signal probe 40A and the head portion contact part center line C1 of the second signal probe 40B (i.e. head portion contact part pitch d1) is larger than the shortest distance between the body portion center line C3 of the first signal probe 40A and the body portion center line C3 of the second signal probe 40B (i.e. body portion pitch d2). Besides, the shortest distance between the tail portion contact part center line C5 of the first signal probe 40A and the tail portion contact part center line C5 of the second signal probe 40B (i.e. tail portion contact part pitch d3) is larger than the shortest distance between the body portion center line C3 of the first signal probe 40A and the body portion center line C3 of the second signal probe 40B (i.e. body portion pitch d2).

It is to be mentioned that in this embodiment, the upper and lower through holes 323, 324, 343, 344 of the probe seat 30 are sized according to the sizes of the tail portion installation parts 411 and head portion installation parts 421 of the probes 40A-C corresponding thereto. In order to position the tail portion installation parts 411 and head portion installation parts 421 in the upper and lower through holes 323, 324, 343, 344 stably, the tail portion installation part 411 and the upper through hole 323, 324 corresponding thereto optionally have roughly equal size on X-axis or Z-axis, and the head portion installation part 421 and the lower through hole 343, 344 corresponding thereto optionally have roughly equal size on X-axis or Z-axis. The mentioned 'roughly equal size' refers to the size just adapted for installation and positioning.

In detail, as shown in FIG. 5, the upper through holes of the upper die unit 32 include distinctive upper through holes 323 for the distinctive probes 40A, 40B to be inserted therethrough, and a standard upper through hole 324 for the standard probe 40C to be inserted therethrough. The lower through holes of the lower die unit 34 include distinctive lower through holes 343 for the distinctive probes 40A, 40B to be inserted therethrough, and a standard lower through hole 344 for the standard probe 40C to be inserted therethrough. The tail portion installation part 411 and head portion installation part 421 of the standard probe 40C are equal in size, so in this embodiment the width D2 of the standard upper through hole 324 equals to the width D3 of the standard lower through hole 344. The tail portion installation part 411 and head portion installation part 421 of the standard probe 40C are smaller in size than the tail portion installation part 411 and head portion installation part 421 of the distinctive probes 40A, 40B, so the width D2 of the standard upper through hole 324 is smaller than the width D1 (as shown in FIG. 4) of the distinctive upper through hole 323, and the width D3 of the standard lower through hole 344 is smaller than the width D4 of the distinctive lower through hole 343. But the present invention is not limited to such size relationship, but adjustable according to the sizes of the probes and installation requirements of different embodied configurations. For example, D2 may be larger than D3, D2 may be equal to D1, or D3 may be equal to D4, as long as the width of the upper stopping part 412 of each of the probes 40A-C is larger than the width of the upper through hole 323, 324 corresponding thereto to enable the probes 40A-C to be positioned in the probe seat 30.

With the above-described structural features of the body portions 43 and head portions 42 of the distinctive probes 40A, 40B, the body portions 43 of the first and second signal probes 40A, 40B can be located close to each other, thereby ensuring an appropriate distance therebetween to increase coupling capacitance so as to achieve the required impedance matching effect. Meanwhile, the body portions 43 of the distinctive probes 40A, 40B can be prevented from too large width W2, so the body portions 43 of the distinctive probes 40A, 40B have no need to be decreased in thickness (on Z-axis) to a very thin extent, and can still have as small area moment of inertia as the standard probe 40C, so that they can apply appropriate and consistent contact force to the device under test and can avoid the problem of instable elasticity when operating. Besides, for the first and second signal probes 40A, 40B, the head portion contact part pitch d1 is larger than the body portion pitch d2, so the head portion contact part pitch d1 of the first and second signal probes 40A, 40B can be arranged correspondingly to the pitch of the electrically conductive contacts of the device under test, not restricted by the requirement of relatively smaller body portion pitch d2 for generating great impedance matching effect. Therefore, the head portion contact parts 423 of the first and second signal probes 40A, 40B can probe the high-speed differential pair of the device under test with a relatively larger pitch.

Further speaking, the body portion 43 usually takes up a relatively larger proportion (e.g., about or more than sixty percent) of the length of the probe, so using the feature of the relatively smaller body portion pitch d2 of the first and second signal probes 40A, 40B to increase coupling capacitance thereof can achieve great impedance matching effect. Besides, that also causes the body portion 43 more liable than the other portions to affect the contact force of the probe to the device under test. Through preventing the body portion 43 from too large width W2 by the above-described configuration, in the condition that the vertical probe head 21 includes a plurality of pairs of signal probes different in aligning direction thereof, the probes can apply appropriate and consistent contact force to the device under test by only a little variation in width and thickness for the probes of different aligning direction. For example, in this embodiment, the offset axis is X-axis and there is a pair of signal probes aligned along X-axis. If there is another pair of signal probes aligned along Z-axis, in the condition that the head portion contact part pitch d1 is 160 μm and the body portion pitch d2 is 80 μm, the width and thickness of the probes aligned along X-axis are 35 μm and 42 μm respectively, the width and thickness of the probes aligned along Z-axis are 42 μm and 35 μm respectively, and they can apply appropriate and consistent contact force to the device under test. Besides, the above-described configuration that the first and second signal probes 40A, 40B are both the distinctive probes and disposed symmetrically with respect to the imaginary reference surface R when in the straight status S1 can cause the head portion contact part pitch d1 and body portion pitch d2 a relatively larger difference therebetween. In the precondition of achieving the required body portion pitch d2 for obtaining the required impedance matching effect, the head portion contact part center line C2 and body portion center line C3 have no need to be deviated from each other to a very large extent and can still achieve the required head portion contact part pitch d1. The imaginary reference surface R in this embodiment is perpendicular to the offset axis (X-axis), but as described above, the first and second signal probes 40A, 40B are unnecessary to be aligned along the offset axis. For example, they may be aligned along Z-axis which is perpendicular to the offset axis (X-axis). In such condition, the first and second signal probes 40A, 40B, when in the straight status S1, are disposed symmetrically with respect to an imaginary reference surface perpendicular to Z-axis, that can also attain the above-described effect.

Figure 9:
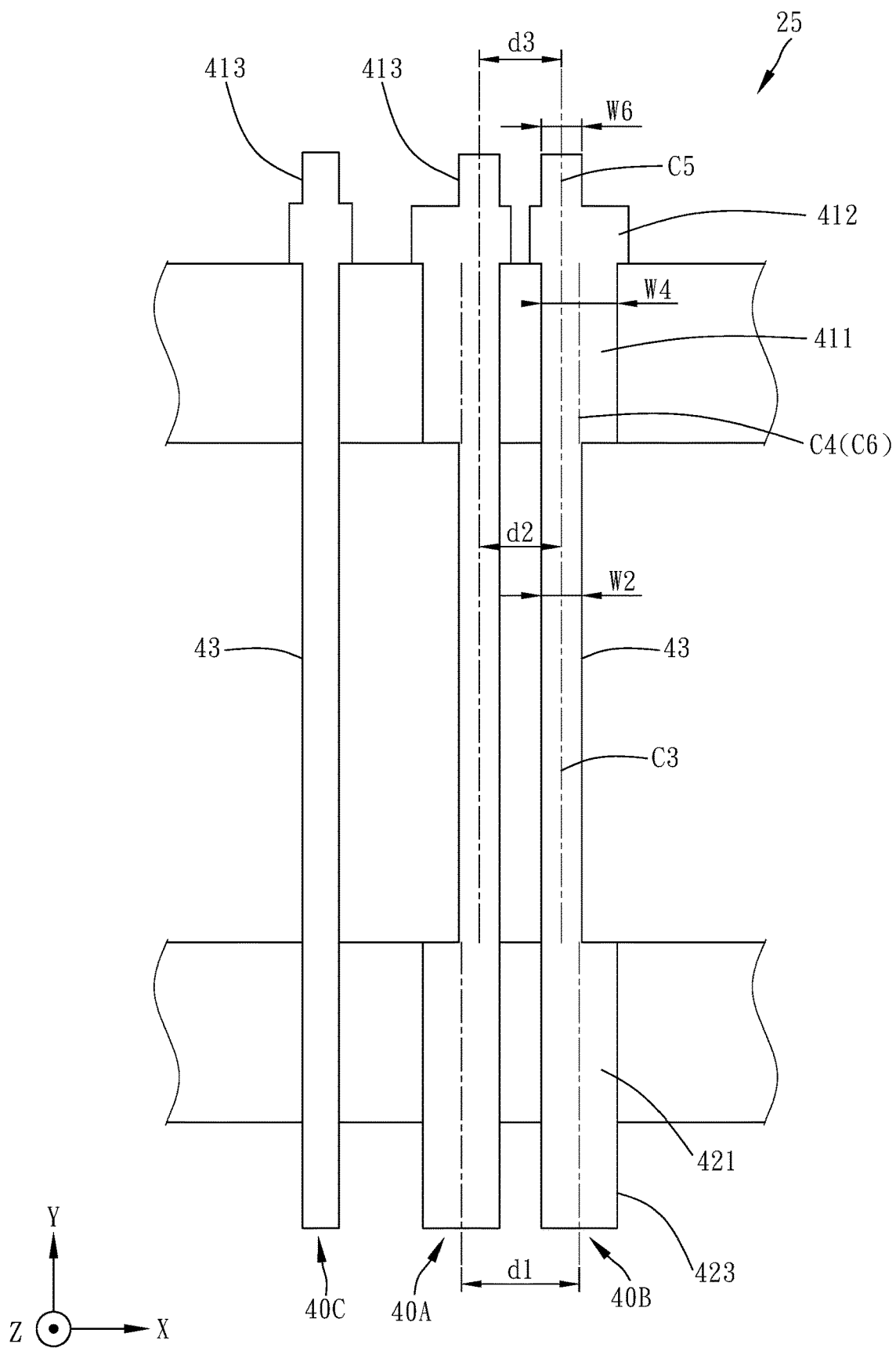
Figure 10:
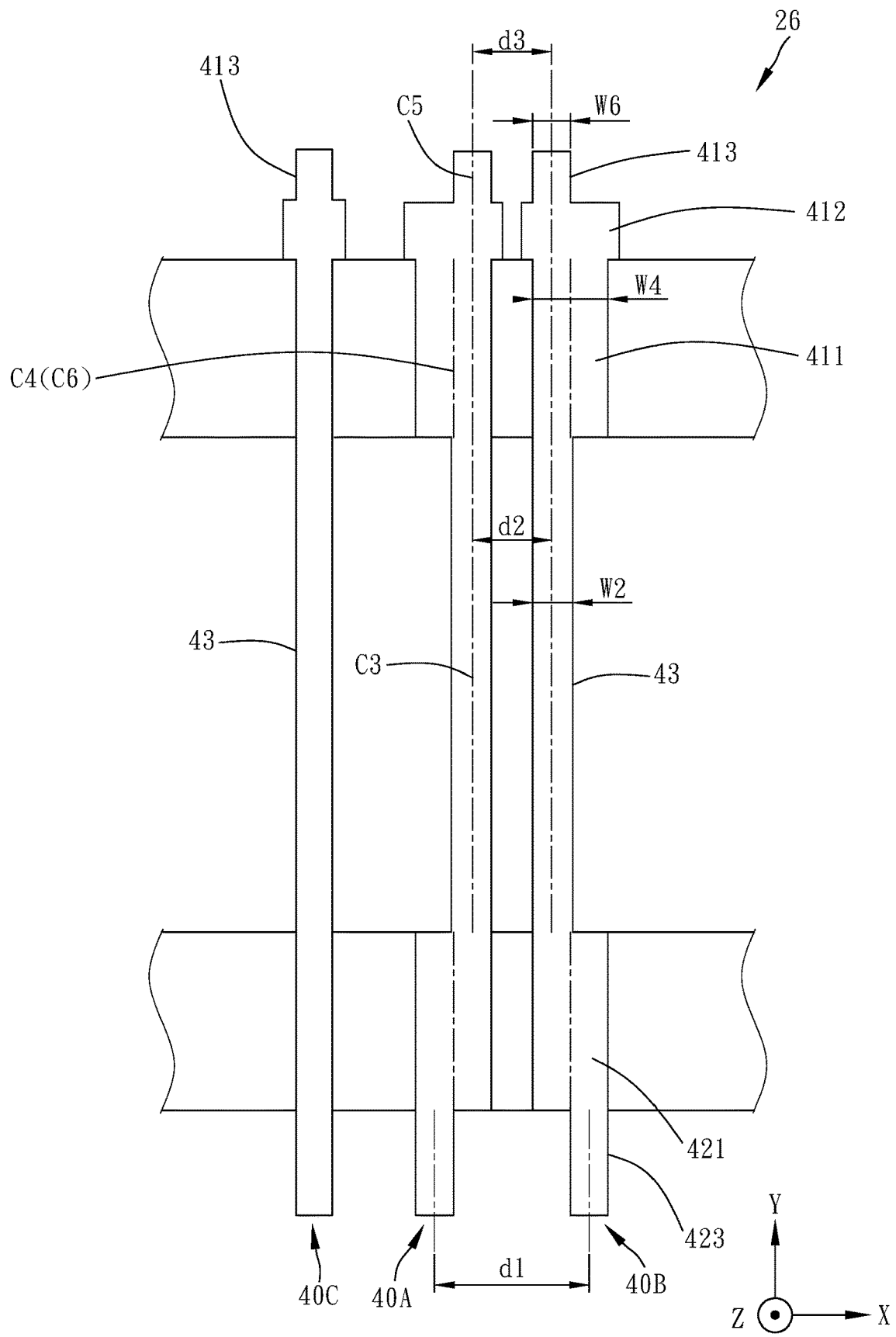

In this embodiment, for the first and second signal probes 40A, 40B, the tail portion contact part pitch d3 is also larger than the body portion pitch d2. This feature is provided to match the pitch of the electrically conductive contacts of the main circuit board of the probe card corresponding thereto, so that the tail portion contact parts 413 of the first and second signal probes 40A, 40B can be abutted against the electrically conductive contacts of the main circuit board of the probe card corresponding thereto. However, as described above, there may be a space transformer disposed between the vertical probe head 21 and the main circuit board. The space transformer may be arranged with upper and lower contacts matching the electrically conductive contacts of the main circuit board and the probes respectively. Therefore, for the first and second signal probes 40A, 40B, the tail portion contact part pitch d3 can be equal to the body portion pitch d2 (as illustrated in FIG. 9 and FIG. 10, that will be specified below), as long as the lower contacts of the space transformer for the first and second signal probes 40A, 40B to be abutted thereagainst are arranged with a pitch corresponding thereto. In other words, for the first and second signal probes 40A, 40B in this embodiment, the width W6 of the tail portion contact part 413 may be equal to the width W2 of the body portion 43.

Figure 6:
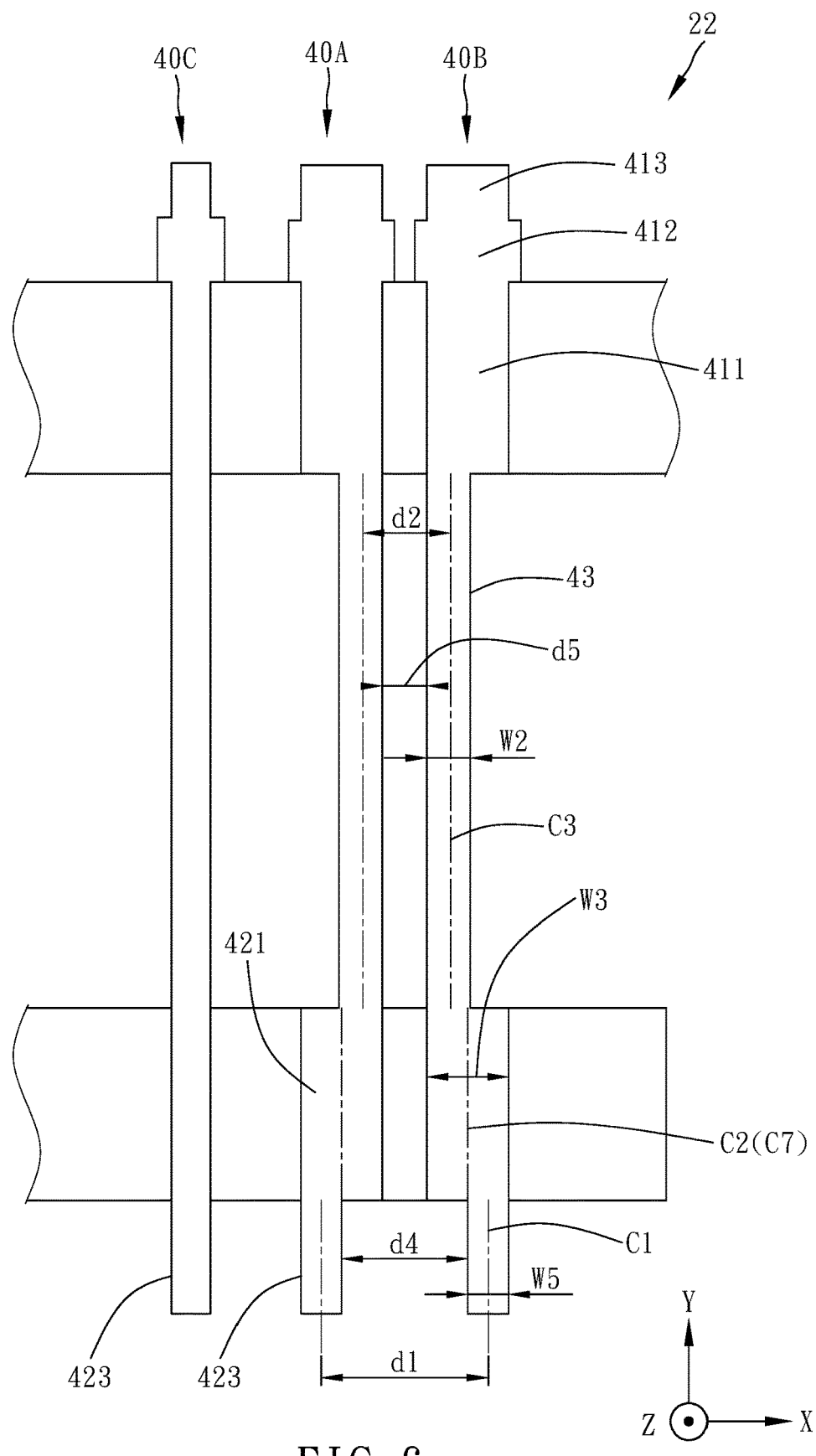
FIG. 6 to FIG. 11 are partial schematic sectional views of vertical probe heads according to second to seventh preferred embodiments of the present invention respectively.

Referring to FIG. 6, a vertical probe head 22 according to a second preferred embodiment of the present invention is similar to the above-described vertical probe head 21 (as shown in FIG. 4), but the difference therebetween lies in the head portion contact parts 423 of the first and second signal probes (distinctive probes) 40A, 40B. In the vertical probe head 22 shown in FIG. 6, the head portion contact parts 423 of the distinctive probes 40A, 40B are approximately equal in width to the head portion contact part 423 of the standard probe 40C. For the distinctive probes 40A, 40B, the width W5 of the head portion contact part 423 is smaller than the width W3 of the head portion installation part 421. For the distinctive probes 40A, 40B, the width W5 of the head portion contact part 423 is approximately equal to the width W2 of the body portion 43. For the distinctive probes 40A, 40B, the head portion contact part center line C1 is deviated from the lower through hole center line C7 corresponding thereto. For the distinctive probes 40A, 40B, the head portion contact part center line C1 is deviated from the head portion installation part center line C2.

As a result, the shortest distance between the head portion contact part center lines C1 of the first and second signal probes 40A, 40B (i.e. the head portion contact part pitch d1) is larger than the shortest distance between the body portion center lines C3 of the first and second signal probes 40A, 40B (i.e. the body portion pitch d2). In other words, for the distinctive probes 40A, 40B of the above-described vertical probe head 21 (as shown in FIG. 4), the structural feature that the head portion contact part pitch d1 is larger than the body portion pitch d2 is achieved by the configuration that the width W5 of the head portion contact part 423 is larger than the width W2 of the body portion 43 (also called widened head portion configuration hereinafter). However, for the distinctive probes 40A, 40B in this embodiment, the structural feature that the head portion contact part pitch d1 is larger than the body portion pitch d2 is achieved by the configuration that the head portion contact part center line C1 is deviated from the head portion installation part center line C2 corresponding thereto (also called deviated head portion configuration hereinafter). Except for the above-described difference, the other structures and the achieved effects of this embodiment are all the same with those of the above-described first preferred embodiment, thereby not repeatedly described here.

Figure 7:
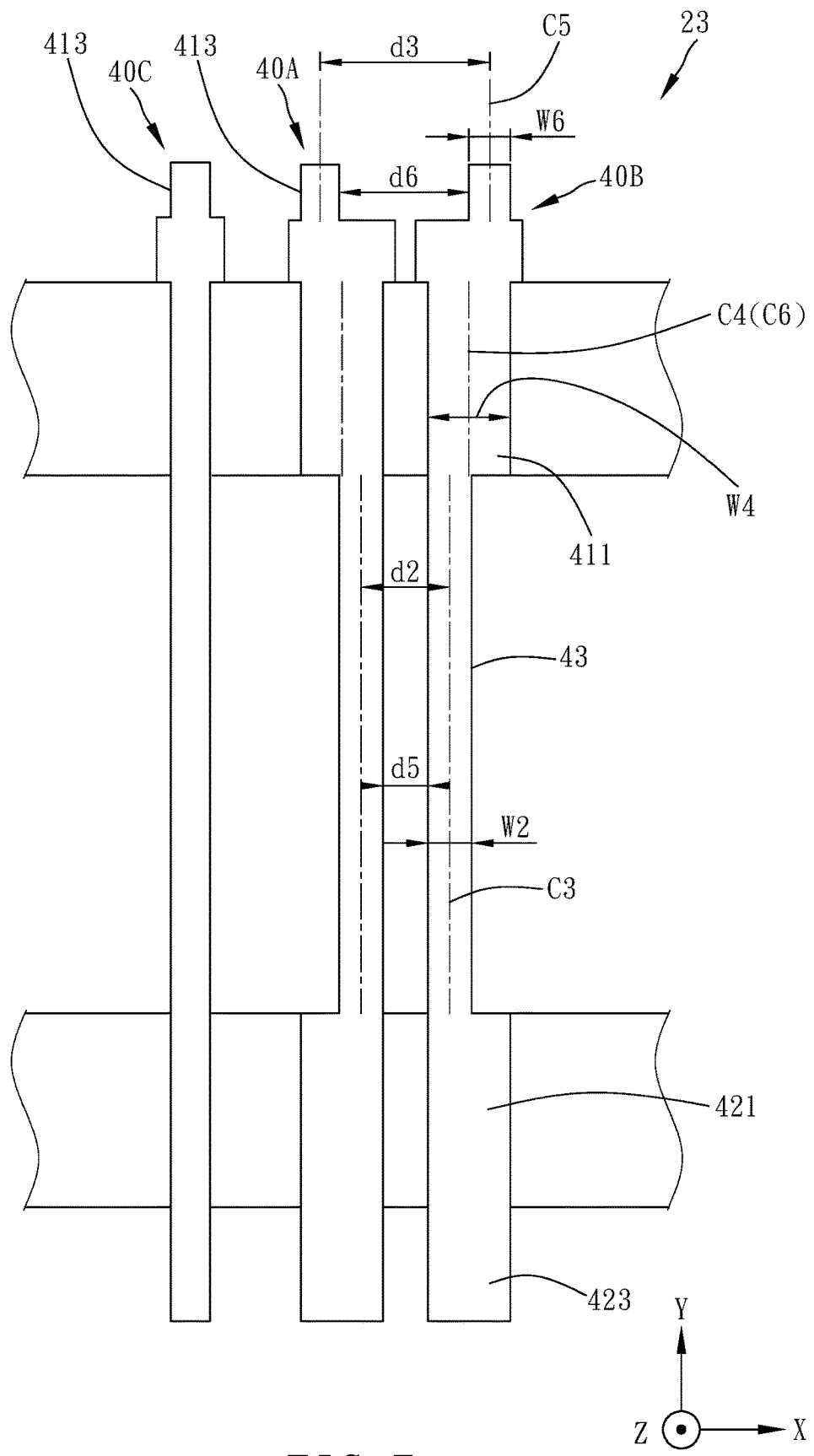

Referring to FIG. 7, a vertical probe head 23 according to a third preferred embodiment of the present invention is similar to the above-described vertical probe head 21 (as shown in FIG. 4), but the difference therebetween lies in the tail portion contact parts 413 of the first and second signal probes (distinctive probes) 40A, 40B. In the vertical probe head 23 shown in FIG. 7, the tail portion contact parts 413 of the distinctive probes 40A, 40B are approximately equal in width to the tail portion contact part 413 of the standard probe 40C. For the distinctive probes 40A, 40B, the width W6 of the tail portion contact part 413 is smaller than the width W4 of the tail portion installation part 411. For the distinctive probes 40A, 40B, the width W6 of the tail portion contact part 413 is approximately equal to the width W2 of the body portion 43. For the distinctive probes 40A, 40B, the tail portion contact part center line C5 is deviated from the upper through hole center line C6 corresponding thereto. For the distinctive probes 40A, 40B, the tail portion contact part center line C5 is deviated from the tail portion installation part center line C4.

As a result, the shortest distance between the tail portion contact part center lines C5 of the first and second signal probes 40A, 40B (i.e. the tail portion contact part pitch d3) is larger than the shortest distance between the body portion center lines C3 of the first and second signal probes 40A, 40B (i.e. the body portion pitch d2). In other words, for the distinctive probes 40A, 40B of the above-described vertical probe head 21 (as shown in FIG. 4), the structural feature that the tail portion contact part pitch d3 is larger than the body portion pitch d2 is achieved by the configuration that the width W6 of the tail portion contact part 413 is larger than the width W2 of the body portion 43 (also called widened tail portion configuration hereinafter). However, for the distinctive probes 40A, 40B in this embodiment, the structural feature that the tail portion contact part pitch d3 is larger than the body portion pitch d2 is achieved by the configuration that the tail portion contact part center line C5 is deviated from the tail portion installation part center line C4 (also called deviated tail portion configuration hereinafter). Except for the above-described difference, the other structures and the achieved effects of this embodiment are all the same with those of the above-described first preferred embodiment, thereby not repeatedly described here.

Figure 8:
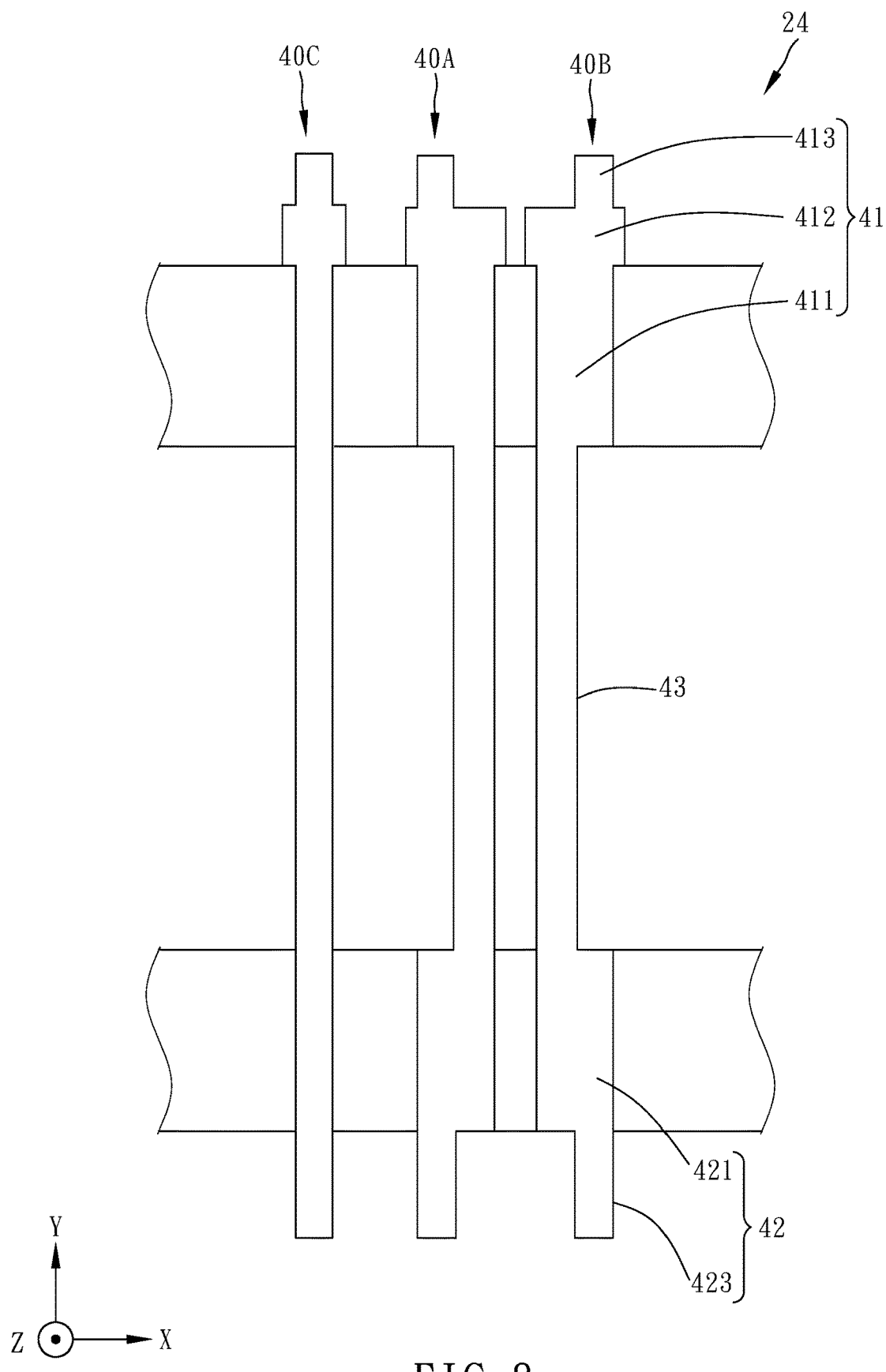

Referring to FIG. 8, a vertical probe head 24 according to a fourth preferred embodiment of the present invention is similar to the above-described vertical probe head 21 (as shown in FIG. 4), but the difference therebetween lies in the head portion contact parts 423 and tail portion contact parts 413 of the first and second signal probes (distinctive probes) 40A, 40B. The head portion contact parts 423 of the distinctive probes 40A, 40B in this embodiment adopt the deviated head portion configuration as shown in FIG. 6. The tail portion contact parts 413 of the distinctive probes 40A, 40B in this embodiment adopt the deviated tail portion configuration as shown in FIG. 7. These two parts are as described in the second and third preferred embodiments, and the other parts and the achieved effects of this embodiment are all the same with those in the above-described first preferred embodiment, thereby not repeatedly described here.

It is to be mentioned that the above-described deviated head portion configuration (as shown in FIG. 6) not only makes the head portion contact part pitch d1 larger than the body portion pitch d2, but also makes the shortest distance d4 between the head portion contact parts 423 of the first and second signal probes 40A, 40B larger than the shortest distance d5 between the body portions 43 of the first and second signal probes 40A, 40B. Such probes can probe the electrically conductive contacts of the device under test more accurately. Likewise, the above-described deviated tail portion configuration (as shown in FIG. 7) not only makes the tail portion contact part pitch d3 larger than the body portion pitch d2, but also makes the shortest distance d6 between the tail portion contact parts 413 of the first and second signal probes 40A, 40B larger than the shortest distance d5 between the body portions 43 of the first and second signal probes 40A, 40B. Such probes can be abutted against the electrically conductive contacts of the circuit board of the probe card more accurately.

Referring to FIG. 9 and FIG. 10, vertical probe heads 25, 26 according to fifth and sixth preferred embodiments of the present invention are similar to the above-described vertical probe heads 21, 22 (as shown in FIG. 4 and FIG. 6), but the vertical probe heads 25, 26 are respectively different from the vertical probe heads 21, 22 in the tail portion contact parts 413 of the first and second signal probes (distinctive probes) 40A, 40B. For the distinctive probes 40A, 40B of the vertical probe heads 25, 26 as shown in FIG. 9 and FIG. 10, the tail portion contact part center line C5 is deviated from the upper through hole center line C6 (i.e. deviated from the tail portion installation part center line C4) corresponding thereto and coaxial with the body portion center line C3, i.e. the same with the standard probe 40C in that the tail portion contact part 413 is not deviated with respect to the body portion 43. In addition, the tail portion contact parts 413 of the distinctive probes 40A, 40B are approximately equal in width to the tail portion contact part 413 of the standard probe 40C. For the distinctive probes 40A, 40B, the width W6 of the tail portion contact part 413 is smaller than the width W4 of the tail portion installation part 411. For the distinctive probes 40A, 40B, the width W6 of the tail portion contact part 413 is approximately equal to the width W2 of the body portion 43.

As described above, for the first and second signal probes 40A, 40B, the tail portion contact part pitch d3 may be equal to the body portion pitch d2. Such structural feature can be achieved by the configuration of the tail portion contact part 413 as shown in FIG. 9 and FIG. 10. The configuration of the head portion contact part 423 should still make the head portion contact part pitch d1 larger than the body portion pitch d2. This part in FIG. 9 is achieved by the widen head portion configuration as that of the vertical probe head 21 (as shown in FIG. 4), and in FIG. 10 is achieved by the deviated head portion configuration as that of the vertical probe head 22 (as shown in FIG. 6). Except for the above-described difference, the other structures and the achieved effects of these two embodiments are all the same with those of the above-described first preferred embodiment, thereby not repeatedly described here.

Figure 11:
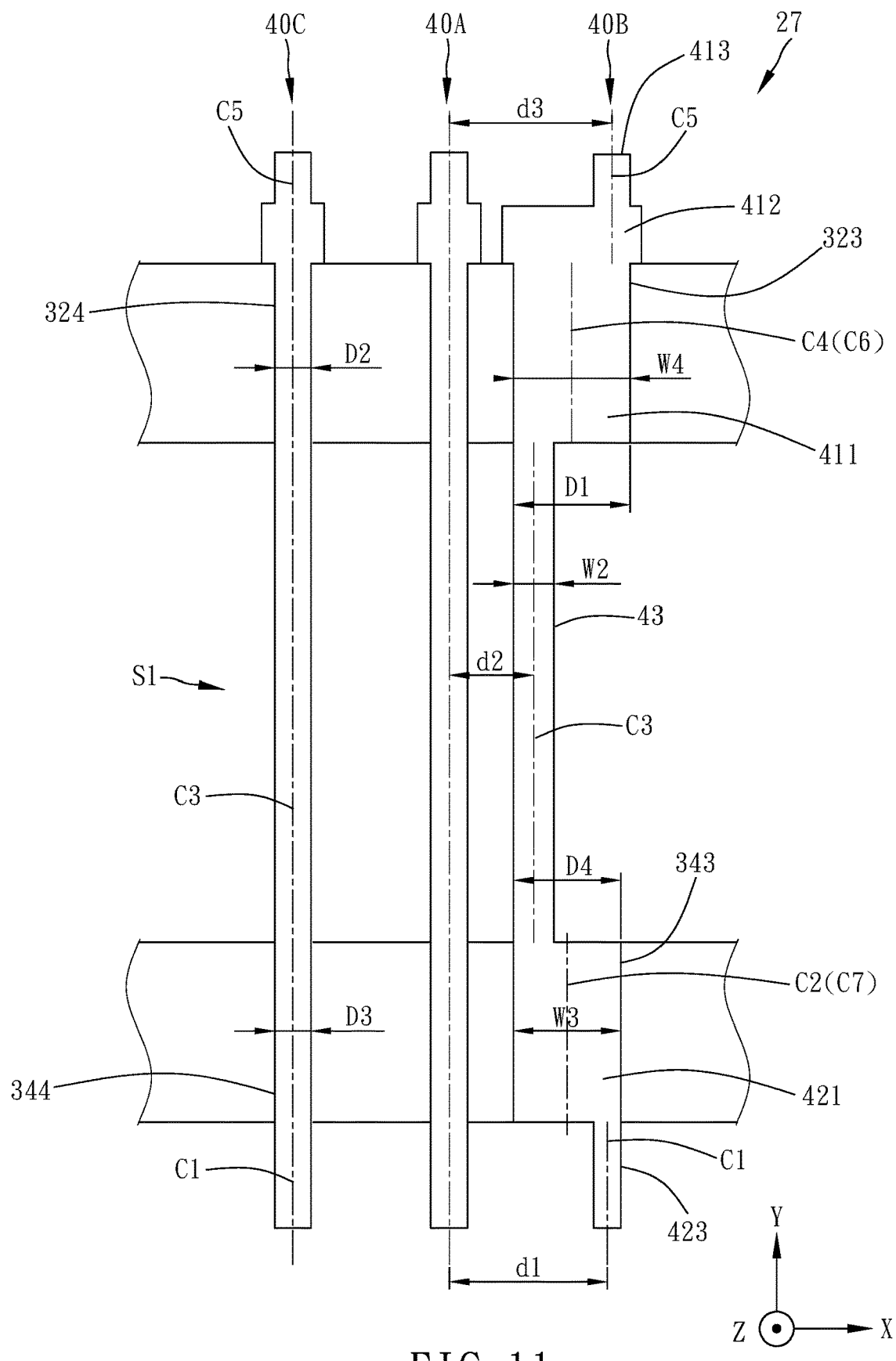

Referring to FIG. 11, a vertical probe head 27 according to a seventh preferred embodiment of the present invention is primarily different from each above-described embodiment in that among the paired first and second signal probes 40A, 40B, only the second signal probe 40B is the distinctive probe, but the first signal probe 40A is the standard probe as same as the third signal probe 40C. In other words, the paired first and second signal probes 40A, 40B in the present invention may be a distinctive probe paired with another distinctive probe, as those in the first to sixth preferred embodiments, or may be a distinctive probe paired with a standard probe, as those in this embodiment, wherein the distinctive probe may adopt anyone of the configurations of the distinctive probes provided in the first to sixth preferred embodiments or the configuration of the distinctive probe provided in this embodiment and specified below.

For the standard probe 40C in each above-described embodiment and the standard probes 40A, 40C in this embodiment, when in the straight status S1, the body portion center line C3, head portion contact part center line C1 and tail portion contact part center line C5 are superimposed on each other. Besides, the width D2 of the upper through holes 324, through which the standard probes 40A, 40C are inserted, is larger than or equal to the width D3 of the lower through holes 344, through which the standard probes 40A, 40C are inserted. For the distinctive probes 40A, 40B in each above-described embodiment and the distinctive probe 40B in this embodiment, when in the straight status S1, the body portion center line C3 is deviated from the head portion installation part center line C2 and tail portion installation part center line C4. Besides, the distinctive probe 40B may adopt the above-described deviated tail portion configuration or widen tail portion configuration in coordination with the deviated head portion configuration or widen head portion configuration, as those provided in the first to fourth preferred embodiments. Alternatively, the distinctive probe 40B may adopt the above-described configuration that the tail portion is not widen and also not deviated, in coordination with the deviated head portion configuration or widen head portion configuration, as those provided in the fifth and sixth preferred embodiments. Besides, for the second signal probe (distinctive probe) 40B in this embodiment, the width W4 of the tail portion installation part 411 is equal to or a little larger than the width W3 of the head portion installation part 421. Therefore, the width D1 of the upper through hole 323, through which the second signal probe 40B is inserted, is equal to or a little larger than the width D4 of the lower through hole 343, through which the second signal probe 40B is inserted. It is to be mentioned that in the condition that the width of the upper through hole where a probe is inserted is larger than the width of the lower through hole where the same probe is inserted, no matter the probe is the distinctive probe or the standard probe, in the probe installation process the lower through hole can be seen through the upper through hole, so it is relatively easier to insert the probe through the upper and lower through holes from top to bottom. In other words, the feature that the width of the upper through hole is larger than the width of the lower through hole is beneficial to the performing of the probe installation process, but the present invention is not limited thereto. As described above, the tail portion installation part and head portion installation part may be roughly equal in width to the upper and lower through holes correspondingly thereto, such that the tail portion installation part and head portion installation part are positioned in the upper and lower through holes more stably. Therefore, in the condition that the width of the upper through hole is larger than the width of the lower through hole, the width of the tail portion installation part may be larger than the width of the head portion installation part, but not limited thereto.

In the condition that only one of the first and second signal probes 40A, 40B is the distinctive probe, the structural feature that the head portion contact part pitch d1 is larger than the body portion pitch d2 can be still achieved in a way that for the distinctive probe the width W2 of the body portion 43 is smaller than the width W3 of the head portion installation part 421, the body portion center line C3 of the distinctive probe is deviated from the head portion installation part center line C2 of itself toward the probe of the same pair, and the above-described widen head portion configuration or deviated head portion configuration, and the structural feature that the tail portion contact part pitch d3 is larger than the body portion pitch d2 can be achieved by the above-described widen tail portion configuration or deviated tail portion configuration. The effects achieved by such structural features are all the same with those in the above-described first preferred embodiment, thereby not repeatedly described here.

At last, it should be mentioned again that the constituent elements disclosed in the above embodiments of the present invention are only taken as examples for illustration, not intended to limit the scope of the present invention. The substitution or variation of other equivalent elements should be included within the scope of the following claims of the present invention.

What is claimed is:

1. A vertical probe head comprising:
   a probe seat comprising an upper die unit and a lower die unit, the upper die unit comprising at least one upper die and a plurality of upper through holes penetrating through the at least one upper die, the lower die unit comprising at least one lower die and a plurality of lower through holes penetrating through the at least one lower die, the upper die unit and the lower die unit each having an upper surface and a lower surface, the lower surface of the upper die unit facing toward the upper surface of the lower die unit; and
   a plurality of probes, each of said probes being inserted through one of said upper through holes and one of said lower through holes and comprising a tail portion, a head portion, and a body portion located between the tail portion and the head portion, the tail portion comprising a tail portion contact part for electrically contacting a circuit board of a probe card, and a tail portion installation part located between the tail portion contact part and the body portion and at least partially accommodated in the upper through hole, the head portion comprising a head portion installation part at least partially accommodated in the lower through hole, and a head portion contact part located below the lower surface of the lower die unit for electrically contacting a device under test, the body portion being located between the lower surface of the upper die unit and the upper surface of the lower die unit, the body portion being defined with a body portion center line, the head portion contact part being defined with a head portion contact part center line, the head portion installation part being defined with a head portion installation part center line;
   wherein the plurality of probes comprise at least one pair of signal probes; the at least one pair of signal probes comprise a first signal probe and a second signal probe located adjacent to each other; at least one of the first signal probe and the second signal probe is a distinctive probe; a width of the body portion of the distinctive probe is smaller than a width of the head portion installation part of the distinctive probe, and the body portion center line of the distinctive probe is deviated from the head portion installation part center line of the distinctive probe itself toward the probe paired with the distinctive probe; a shortest distance between the head portion contact part center line of the first signal probe and the head portion contact part center line of the second signal probe is larger than a shortest distance between the body portion center line of the first signal probe and the body portion center line of the second signal probe.

2. The vertical probe head as claimed in claim 1, wherein the head portion contact part center line of the distinctive probe is deviated from the head portion installation part center line of the distinctive probe.

3. The vertical probe head as claimed in claim 1, wherein a width of the head portion contact part of the distinctive probe is larger than the width of the body portion of the distinctive probe.

4. The vertical probe head as claimed in claim 3, wherein the tail portion contact part of each of said probes is defined with a tail portion contact part center line; the tail portion installation part of each of said probes is defined with a tail portion installation part center line; the tail portion contact part center line of the distinctive probe is deviated from the tail portion installation part center line of the distinctive probe.

5. The vertical probe head as claimed in claim 3, wherein a width of the tail portion contact part of the distinctive probe is larger than the width of the body portion of the distinctive probe.

6. The vertical probe head as claimed in claim 3, wherein the tail portion contact part of each of said probes is defined with a tail portion contact part center line; the tail portion installation part of each of said probes is defined with a tail portion installation part center line; the tail portion contact part center line of the distinctive probe is deviated from the tail portion installation part center line of the distinctive probe and coaxial with the body portion center line.

7. The vertical probe head as claimed in claim 2, wherein the tail portion contact part of each of said probes is defined with a tail portion contact part center line; the tail portion installation part of each of said probes is defined with a tail portion installation part center line; the tail portion contact part center line of the distinctive probe is deviated from the tail portion installation part center line of the distinctive probe.

8. The vertical probe head as claimed in claim 2, wherein a width of the tail portion contact part of the distinctive probe is larger than the width of the body portion of the distinctive probe.

9. The vertical probe head as claimed in claim 2, wherein the tail portion contact part of each of said probes is defined with a tail portion contact part center line; the tail portion installation part of each of said probes is defined with a tail portion installation part center line; the tail portion contact part center line of the distinctive probe is deviated from the tail portion installation part center line of the distinctive probe and coaxial with the body portion center line.

10. The vertical probe head as claimed in claim 1, wherein the tail portion contact part of each of said probes is defined with a tail portion contact part center line; the tail portion installation part of each of said probes is defined with a tail portion installation part center line; the upper die unit and the lower die unit are adapted to be offset from each other along a horizontal axis to cause each of said probes to transform from a straight status into a buckled status; when the first signal probe and the second signal probe are in the straight status, the body portion center line, the head portion contact part center line and the tail portion contact part center line of the first signal probe are superimposed on each other, and the body portion center line of the second signal probe is deviated from the head portion installation part center line and the tail portion installation part center line of the second signal probe; a width of the upper through hole, through which the first signal probe is inserted, is larger than or equal to a width of the lower through hole, through which the first signal probe is inserted; a width of the upper through hole, through which the second signal probe is inserted, is larger than or equal to a width of the lower through hole, through which the second signal probe is inserted.

11. The vertical probe head as claimed in claim 10, wherein the head portion contact part center line of the second signal probe is deviated from the head portion installation part center line of the second signal probe.

12. The vertical probe head as claimed in claim 10, wherein a width of the head portion contact part of the second signal probe is larger than the width of the body portion of the second signal probe.

13. The vertical probe head as claimed in claim 12, wherein the tail portion contact part center line of the second signal probe is deviated from the tail portion installation part center line of the second signal probe.

14. The vertical probe head as claimed in claim 12, wherein a width of the tail portion contact part of the second signal probe is larger than the width of the body portion of the second signal probe.

15. The vertical probe head as claimed in claim 11, wherein the tail portion contact part center line of the second signal probe is deviated from the tail portion installation part center line of the second signal probe.

16. The vertical probe head as claimed in claim 11, wherein a width of the tail portion contact part of the second signal probe is larger than the width of the body portion of the second signal probe.

17. The vertical probe head as claimed in claim 1, wherein the tail portion contact part of each of said probes is defined with a tail portion contact part center line; a shortest distance between the tail portion contact part center line of the first signal probe and the tail portion contact part center line of the second signal probe is larger than the shortest distance between the body portion center line of the first signal probe and the body portion center line of the second signal probe.

18. The vertical probe head as claimed in claim 1, wherein a shortest distance between the tail portion contact part of the first signal probe and the tail portion contact part of the second signal probe is larger than a shortest distance between the body portion of the first signal probe and the body portion of the second signal probe.

19. The vertical probe head as claimed in claim 1, wherein the upper through holes of the upper die unit comprise at least one distinctive upper through hole for insertion of the distinctive probe therethrough, and at least one standard upper through hole; the lower through holes of the lower die unit comprise at least one distinctive lower through hole for insertion of the distinctive probe therethrough, and at least one standard lower through hole; a width of the standard upper through hole is larger than or equal to a width of the standard lower through hole; the width of the standard upper through hole is smaller than or equal to a width of the distinctive upper through hole; the width of the standard lower through hole is smaller than or equal to a width of the distinctive lower through hole; the plurality of probes further comprise at least one third signal probe; the third signal probe is inserted through the standard upper through hole and the standard lower through hole.

20. The vertical probe head as claimed in claim 1, wherein the vertical probe head is defined with a first horizontal axis and a second horizontal axis perpendicular to each other; the upper die unit and the lower die unit are adapted to be offset from each other along the first horizontal axis to cause each of said probes to transform from a straight status into a buckled status; the first signal probe and the second signal probe are both said distinctive probes; when in the straight status, the first signal probe and the second signal probe are disposed symmetrically with respect to an imaginary reference surface perpendicular to one of the first horizontal axis and the second horizontal axis.

21. The vertical probe head as claimed in claim 1, wherein the first signal probe and the second signal probe each further comprise an upper stopping part located above the upper through hole; a width of the upper stopping part is larger than a width of the upper through hole; the upper stopping part is provided between the tail portion installation part and the tail portion contact part.

* * * * *